United States Patent
Heedley et al.

(10) Patent No.: US 6,977,543 B2
(45) Date of Patent: Dec. 20, 2005

(54) BIASING TECHNIQUE USING THIN AND THICK OXIDE TRANSISTORS

(75) Inventors: Perry L. Heedley, Folsom, CA (US); Kenneth C. Dyer, Davis, CA (US)

(73) Assignee: Intel Corporation, Santa Clara, CA (US)

( * ) Notice: Subject to any disclaimer, the term of this patent is extended or adjusted under 35 U.S.C. 154(b) by 5 days.

(21) Appl. No.: 10/649,098

(22) Filed: Aug. 26, 2003

(65) Prior Publication Data

US 2005/0046459 A1 Mar. 3, 2005

(51) Int. Cl.$^7$ ................................................. G06G 7/12
(52) U.S. Cl. .................................................... 327/563
(58) Field of Search ................................. 327/560, 561, 327/562, 563, 564, 565, 566; 330/253, 257, 258

(56) References Cited

U.S. PATENT DOCUMENTS

| | | | |
|---|---|---|---|
| 5,187,448 A | | 2/1993 | Brooks et al. |
| 5,955,922 A | * | 9/1999 | Nicollini et al. ............ 330/258 |
| 6,265,941 B1 | | 7/2001 | Lopata |
| 6,388,522 B1 | | 5/2002 | Fattaruso et al. |
| 6,774,696 B2 | * | 8/2004 | Clark et al. ................. 327/333 |

* cited by examiner

*Primary Examiner*—Jeffrey Zweizig
(74) *Attorney, Agent, or Firm*—Blakely, Sokoloff, Taylor & Zafman LLP

(57) ABSTRACT

A biasing technique between a first circuit stage and a second circuit stage is described. Specifically, the technique comprises using a combination of thin and thick oxide transistors.

9 Claims, 3 Drawing Sheets

BIASING TECHNIQUE USING THIN AND THICK OXIDE TRANSISTORS

FIELD OF THE INVENTION

The present invention pertains to the field of integrated circuit design. More particularly, the present invention relates to a biasing technique using thin and thick oxide transistors.

BACKGROUND OF THE INVENTION

Operational amplifiers have many different applications in analog circuit and system design. For instance, operational amplifiers are often used in analog-to-digital (A/D) converters. An ideal operational amplifier has infinite gain, infinite input resistance, and zero output resistance. An actual operational amplifier is typically designed to closely approximate the characteristics of the ideal operational amplifier.

The trend in integrated circuit (IC) design is towards reduced geometries and power supply voltages. However, transistors used in deep sub-micron CMOS processes typically have shorter channel lengths. Transistors having shorter channel lengths tend to have lower output impedance. Furthermore, the use of lower power supply voltages makes it impracticable to stack as many devices between power supplies. As a result, it is becoming increasingly difficult to use standard analog techniques such as single-stage operational amplifiers to achieve high gains typically required by A/D converters and other analog signal processing circuits.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Circuits employing switched capacitor techniques have traditionally used single-stage operational amplifiers due to their robust nature and ease of design. Resistors are sometimes avoided in integrated circuits because resistors may increase power dissipation and consume chip area. Therefore, switched capacitor circuits are typically constructed using only transistors and capacitors. Transistor switches and on-chip capacitors are instead used to emulate resistors. In other words, switches and capacitors are used in combination to perform the same function as resistors.

Two-stage operational amplifiers may provide greater gains than traditional single-stage operational amplifiers. As a result, two-stage operational amplifiers may provide sufficient gains in reduced geometry processes. However, the use of two-stage operational amplifiers in switched capacitor circuits may present new challenges. For example, a two-stage operational amplifier provides the opposite polarity of feedback as a single-stage operational amplifier. The common mode gain for a single-stage operational amplifier is inverting while this same gain for a two-stage operational amplifier is noninverting. Therefore, a traditional common mode feedback circuit may have the wrong feedback polarity if the feedback is supplied by a two-stage operational amplifier that provides a positive feedback.

Figure 1:
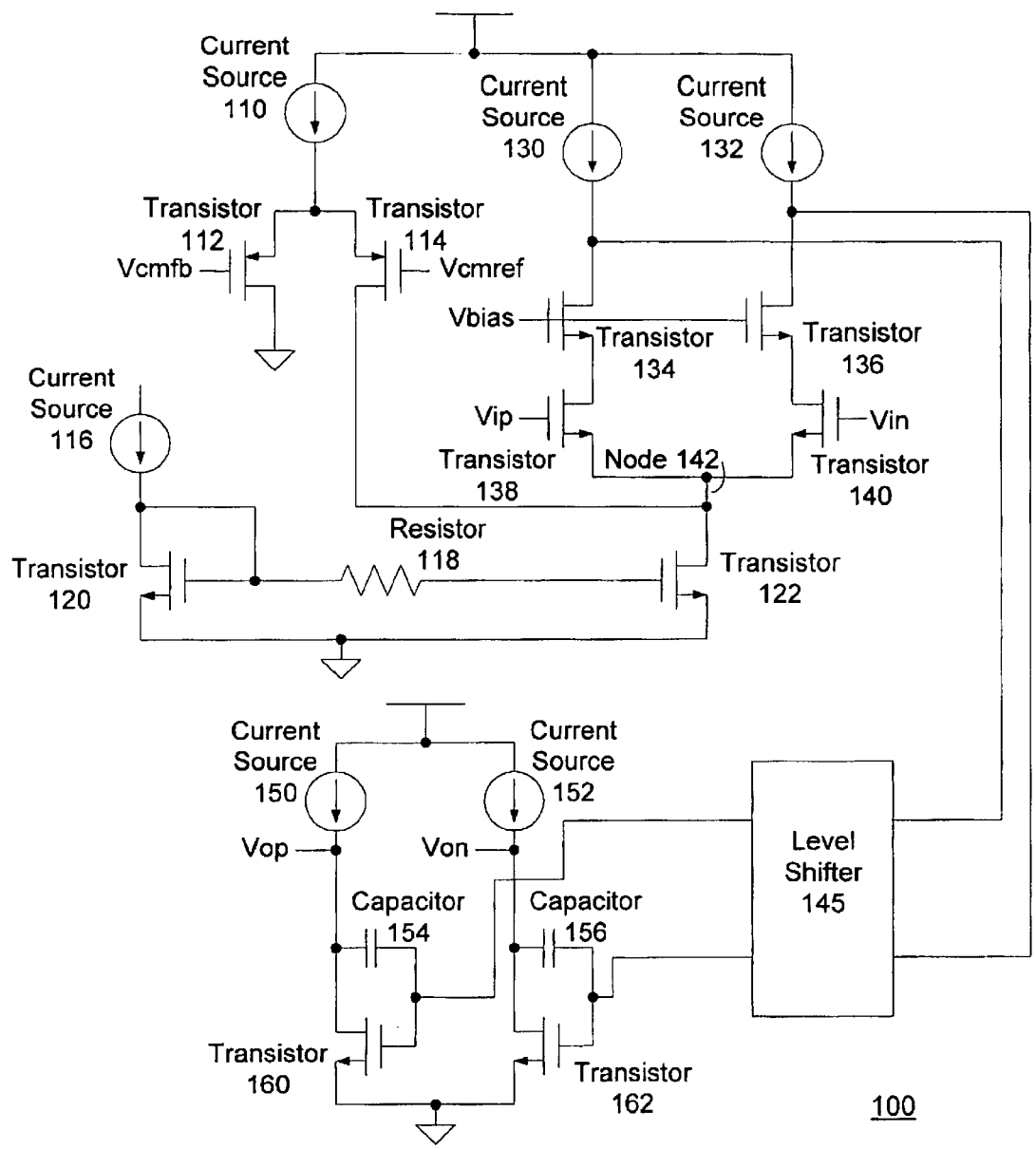
FIG. 1 is an embodiment of a differential two-stage operational amplifier.

FIG. 1 depicts one embodiment of a two-stage operational amplifier that provides negative feedback. Current source 110 is coupled to transistors 112 and 114. Current source 116 is coupled to transistor 120 and resistor 118. Transistor 114 and resistor 118 are coupled to transistor 122. Current source 130 is coupled to transistors 134 and 138 and level shifter 145. Current source 132 is coupled to transistors 136 and 140 and level shifter 145. Level shifter 145 is coupled to capacitors 154 and 156 and transistors 160 and 162. Capacitor 154 is coupled to current source 150. Capacitor 156 is coupled to current source 152.

For one embodiment of the invention, transistors 112, 114, 120, 122, 134, 136, 138, and 140 are formed in a 0.25 micron processing technology. Thus, the gate width of each transistor is approximately 0.25 micron. The invention, however, does not rely upon a specific processing technology. For another embodiment of the invention, transistors 112, 114, 120, 122, 134, 136, 138, and 140 have gate widths of greater than or less than 0.25 micron.

The input stage of the circuit of FIG. 1 comprises a cascoded n-channel differential amplifier with current source loads. Transistors 134, 136, 138, and 140 form the differential amplifier, while the current source loads are provided by current sources 130 and 132. Assuming the input resistance of the level shifter 145 to be infinite, the input stage has a voltage gain (Av1) defined by the formula $$Av1 \approx gm138*[ro130//(gm134*rds134*rds138)].$$

Gm138 is the transconductance of transistor 138; ro130 is the small-signal output resistance of current source 130; gm134 is the transconductance of transistor 134; rds134 is the small-signal output resistance of transistor 134; and rds138 is the small-signal output resistance of transistor 138.

The input stage drives a second gain stage comprising two n-channel common source amplifiers with current source loads. Level shifter 145 is coupled between the first stage and the second stage because the transistors of the second stage may have different biasing points than the transistors of the first stage. The second gain stage provides differential outputs. Transistors 160 and 162, capacitors 154 and 156, and current sources 150 and 152 form the common source amplifiers. Current sources 150 and 152 provide current to transistors 160 and 162 respectively. Compensation capacitors 154 and 156 maintain the currents between the gate and drain of transistors 160 and 162. The second gain stage has a gain (Av2) defined by the formula:

$$Av2 \approx gm160*[rds160//ro150].$$

Gm160 is the transconductance of transistor 160; rds160 is the small-signal output resistance of transistor 160; and ro150 is the small-signal output resistance of current source 150. Assuming the level shifter 145 is ideal and has a unity voltage gain, the overall gain of the two-stage operational amplifier is approximately equal to the product of Av1 and Av2.

Figure 2:
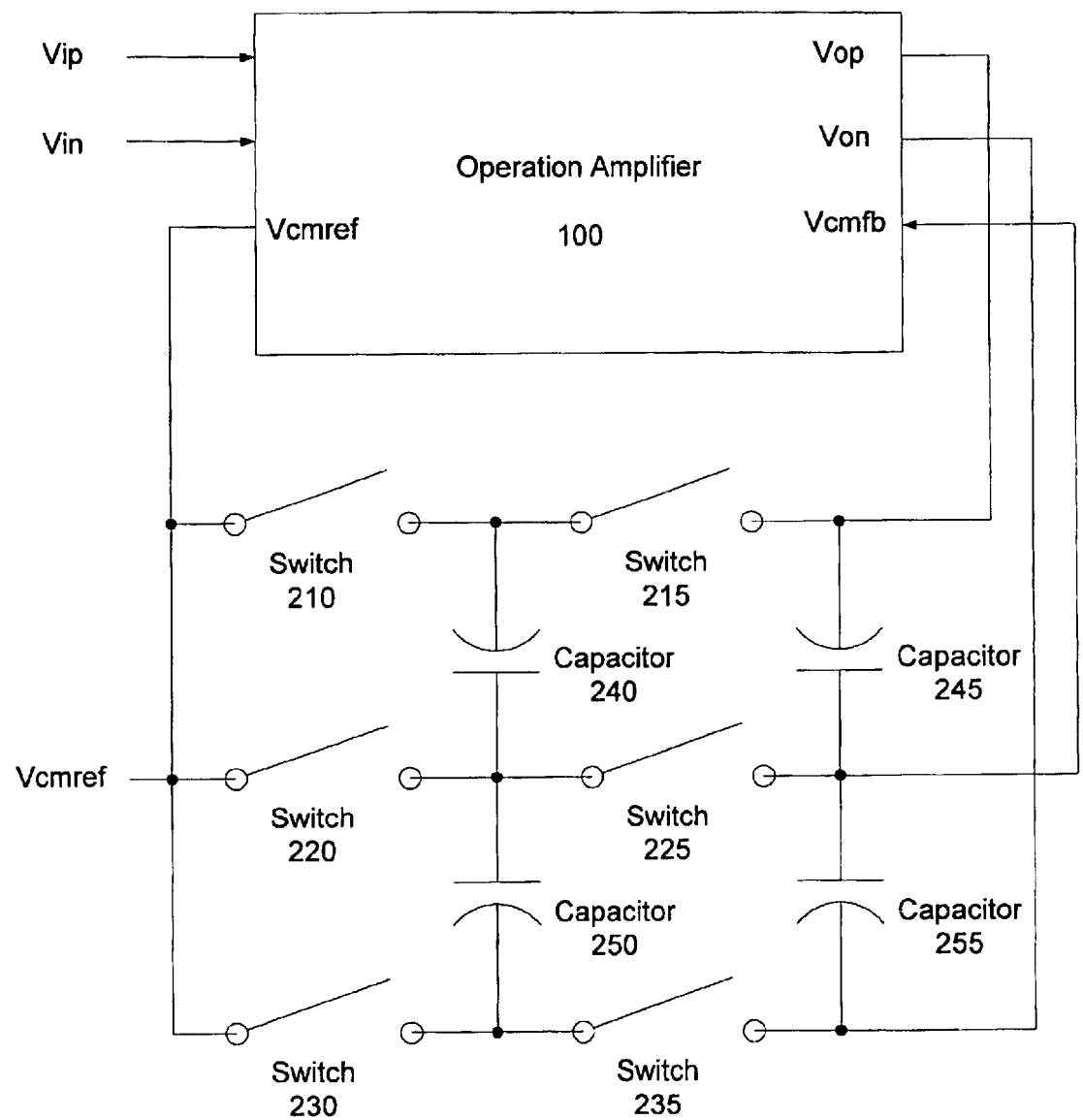
FIG. 2 is an embodiment of a switched capacitor circuit coupled to a two-stage operational amplifier.

The second gain stage outputs, Vop and Von, provide a common mode feedback through a switched-capacitor circuit. An embodiment of a switched-capacitor circuit that may be used with the two-stage operational amplifier of FIG. 1 is depicted in FIG. 2. Switch 210 and switch 220 are coupled to capacitor 240. Switch 220 and switch 230 are coupled to capacitor 250. Capacitor 240 is coupled to switch 215 and switch 225. Capacitor 250 is coupled to switch 225 and switch 235. Switch 215 and switch 225 are coupled to capacitor 245. Switch 225 and switch 235 are coupled to capacitor 255.

The switches 210, 215, 220, 225, 230, and 235 of the switched capacitor circuit may be toggled by clock signals. Switch 210, switch 220, and switch 230 may be clocked by a first clock, while switch 215, switch 225, and switch 235 may be clocked by a second clock. The first clock and the second clock may be non-overlapping clocks having equal frequencies. The clocks, however, may have different phases. Switch 210, switch 215, and capacitor 240 may emulate a first resistor, while switch 230, switch 235, and capacitor 250 may emulate a second resistor. Capacitors 240 and 250 may have approximately the same capacitance. Capacitors 245 and 255 may have approximately the same capacitance.

A common mode voltage reference bias, Vcmref, is provided to the switched capacitor circuit. Vcmref, is coupled to the gate of transistor 114 and to switches 210, 220, and 230. Capacitors 245 and 255 couple the common mode outputs of the operational amplifier outputs, Vop and Von, to the gate of transistor 112, Vcmfb.

Current source 110, transistor 112, and transistor 114 form a common mode feedback circuit. As stated above, the input stage of the operational amplifier 100 comprises a cascoded n-channel differential amplifier. A bias voltage, Vbias, is provided to transistors 134 and 136. Transistor 134 is coupled to transistor 138 and transistor 136 is coupled to transistor 140. The source currents of transistors 138 and 140 are fed into node 142. To increase the common mode input range, Vbias may be referenced to node 142. A biasing circuit comprising current source 116, transistor 120, and resistor 118 biases the current flowing through transistor 122.

If the output common mode voltage provided by Vop and Von rises above Vcmref, the current flowing through transistor 114 to node 142 increases. Since the biasing circuit maintains a constant current across the drain and source of transistor 122, the biasing current flowing through transistors 138 and 140 decreases. As a result, the output common mode voltage of the input stage, which is coupled to the level shifter 145, increases. The overall output common mode voltage of the operational amplifier as measured at Vop and Von decreases.

The level shifter circuit 145, however, may be removed from a circuit comprising a first stage and a second stage. For one embodiment of the invention, the first stage comprises thin oxide transistors, while the second stage comprises thick oxide transistors. The first stage may comprise a plurality of stacked n-channel transistors. The output of the first stage may be measured at a drain of a thin oxide n-channel transistor that is at the top of the transistor stack.

The output of the first stage is coupled to the input of the second stage. The input of the second stage is the gate of a thick oxide n-channel transistor. The source of the thick oxide n-channel transistor may be coupled to ground. The thick oxide transistor may have a higher threshold voltage than the thin oxide transistor. As a result, the gate-to-source voltage of the thick oxide transistor may be increased to allow the drain voltage of the thin oxide transistor to be kept at a saturation level.

Figure 3:
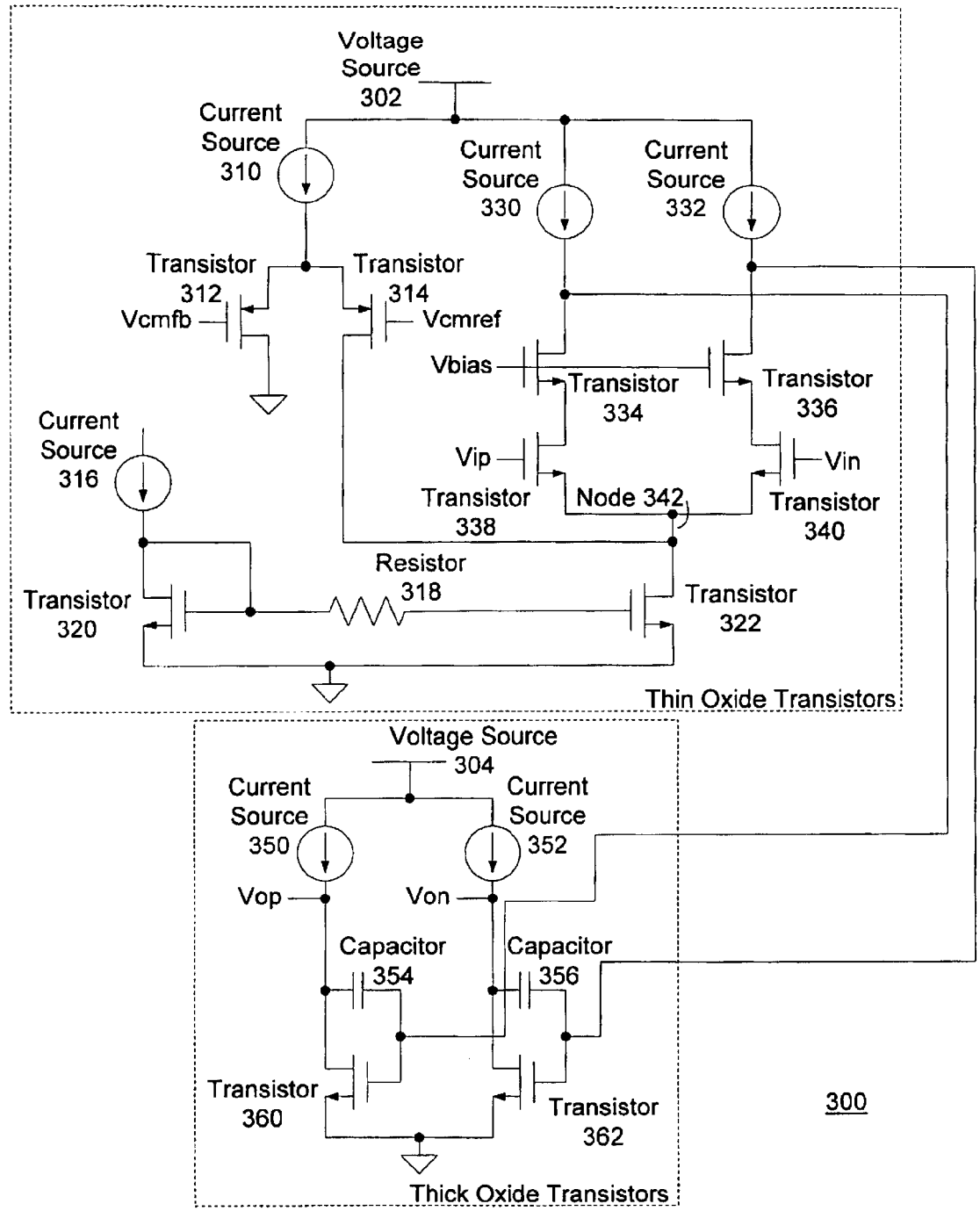
FIG. 3 is another embodiment of a differential two-stage operational amplifier.

FIG. 3 depicts an example of a two-stage operational amplifier with negative feedback without a level shifter between the first stage and the second stage. Current source 310 is coupled to transistors 312 and 314. The drain current of transistor 314 may be fed into node 342. Current source 310, transistor 312, and transistor 314 form a feedback circuit.

Current source 316 is coupled to transistor 320. Transistor 320 is coupled to resistor 318. Resistor 318 is coupled to transistor 322. Current source 316, transistor 320, resistor 318, and transistor 322 form a biasing circuit that provides a biasing current to node 342.

Current source 330 is coupled to transistor 334. Transistor 334 is coupled to transistor 338. Current source 332 is coupled to transistor 336. Transistor 336 is coupled to transistor 340. The source current of transistor 338 and the source current of transistor 340 may be fed into node 342. Current source 330, current source 332, transistor 334, transistor 336, transistor 338, and transistor 340 form a first gain stage.

Capacitor 354 and transistor 360 are coupled to transistor 334. Current source 350 is coupled to capacitor 354 and transistor 360. Capacitor 356 and transistor 362 are coupled to transistor 336. Current source 352 is coupled to capacitor 356 and transistor 362. Current source 350, current source 352, capacitor 354, capacitor 356, transistor 360, and transistor 362 form a common source amplifier and functions as a second gain stage.

The transistors of the first gain stage may be formed using thin oxides. The transistors of the second gain stage may be formed using thick oxides. For one embodiment of the invention, each of the thick oxide transistors of the second gain stage may have an oxide thickness that is two times as thick as each of the oxide thickness of the thin oxide transistors of the first gain stage. The thin oxide transistors may have an oxide thickness of approximately 20 angstroms. The thick oxide transistors may have a larger threshold voltage than the thin oxide transistors. The transistors of the first gain stage and the transistors of the second gain stage may be MOSFET transistors.

For another embodiment of the invention, each of the thick oxide transistors of the second gain stage may have an oxide thickness that is 3.5 times as thick as each of the oxide thickness of the thin oxide transistors of the first gain stage. The thin oxide transistors may have an oxide thickness of approximately 20 angstroms and the thick oxide transistors may have an oxide thickness of 70 angstroms.

The first gain stage comprises cascoded n-channel differential amplifier with current source loads 330 and 332. The cascoded n-channel differential amplifier comprises transistors 334, 336, 338, and 340. The output of the first gain stage is a function of the input voltages as measured at the input, Vip, of transistor 338 and at the input, Vin, of transistor 340.

The output of the first gain stage drives the second gain stage. The second gain stage comprises two n-channel common source amplifiers with current source loads 350 and 352. The first common source amplifier of the second gain stage comprises current source 350, capacitor 354, and transistor 360. The second common source amplifier of the second gain stage comprises current source 352, capacitor 356, and transistor 362. The two n-channel common source amplifiers provide differential outputs, Vop and Von. The outputs of the second gain stage may be fed to a switched capacitor circuit, such as the one depicted in FIG. 2. The switched capacitor circuit may then couple the output of the second gain stage to the feedback circuit.

The first gain stage of the operational amplifier may have a first voltage source 302. The first voltage source 302 may be sufficiently high to allow the differential pair to be cascoded to achieve the voltage gain required. For this embodiment of the invention, the first voltage source 302 may be 1.8 volts.

The second voltage source 304 may be less than the first voltage source 302 to reduce the operational amplifier's power consumption. The second voltage source 304 may be 1.2 volts. The n-channel devices of the second gain stage may be thick oxide transistors that provide both gain and level shift functions when used with the first gain stage. The thick oxide transistors 354 and 356 may have a higher threshold voltage and a lower mobility than thin oxide transistors 334, 336, 338, and 340. As a result, the gate-to-source voltages of transistors 360 and 362 may be sufficiently increased to keep the transistors 334, 336, 338, and 340 in saturation even without a level shift circuit between the first stage and the second stage. The gate-to-source voltage of transistor 360 is coupled to the drain of transistor 334 and the gate-to-source voltage of transistor 362 is coupled to the drain of transistor 336. Because the threshold voltage of the thick oxide transistors is large enough to provide sufficient voltage across the devices in the first stage for proper operation, a level shift circuit may not be required. Combining the level shift function with the amplification function in the second stage may simplify the design of the operational amplifier, save area, and consume less power.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. An integrated circuit (IC), comprising:
    a cascoded n-channel differential amplifier with current source loads, wherein the differential amplifier comprises thin oxide transistors; and
    a common source amplifier coupled to the differential amplifier, wherein the common source amplifier comprises a thick oxide transistor, wherein the common source amplifier biases the differential amplifier.

2. The IC of claim 1, wherein the first common source amplifier provides a gain.

3. The IC of claim 1, wherein the differential amplifier comprises a current source coupled to a first transistor, wherein a source of the first transistor is coupled to a drain of a second transistor, wherein a source of the second transistor is coupled to a drain of a third transistor, wherein a source of the third transistor is coupled to a ground, wherein a gate of the thick oxide transistor is coupled to a drain of the first transistor.

4. The IC of claim 3, wherein a threshold voltage of the thick oxide transistor allows a gate to source voltage of the thick oxide transistor to keep the drain of the first transistor in a saturation region.

5. The IC of claim 1, further comprising:
    a circuit coupled to the differential amplifier to provide common mode feedback.

6. A method comprising:
    generating a first gain through a first circuit having stacked transistors of a first oxide thickness;
    generating a second gain through a second circuit having transistors of a second oxide thickness, wherein the second oxide thickness is greater than the first oxide thickness, wherein the second circuit is coupled to the first circuit, wherein the second circuit provides DC coupling between the first circuit and the second circuit, wherein the second circuit has a lower power supply than the first circuit.

7. The method of claim 6, further comprising:
    generating a common mode output voltage.

8. The method of claim 7, further comprising:
    providing a negative feedback to the first circuit.

9. The method of claim 8, further comprising:
    reducing the common mode output voltage if the common mode output voltage rises above a reference voltage.

* * * * *